United States Patent
Hatori et al.

(10) Patent No.: US 7,522,647 B2
(45) Date of Patent: Apr. 21, 2009

(54) SEMICONDUCTOR LASER AND METHOD OF FABRICATING THE SAME

(75) Inventors: Nobuaki Hatori, Kawasaki (JP); Tsuyoshi Yamamoto, Kawasaki (JP); Koji Otsubo, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 0 days.

(21) Appl. No.: 11/341,588

(22) Filed: Jan. 30, 2006

(65) Prior Publication Data
US 2006/0222028 A1    Oct. 5, 2006

(30) Foreign Application Priority Data
Mar. 31, 2005    (JP)    ............ 2005-104448

(51) Int. Cl.
H01S 5/00    (2006.01)
(52) U.S. Cl. ............ 372/45.01; 372/43.01; 372/44.01; 372/66; 372/68; 257/14; 257/22; 257/103
(58) Field of Classification Search ............ 372/44.01, 372/43.01, 66, 68; 257/14, 22, 103
See application file for complete search history.

(56) References Cited

U.S. PATENT DOCUMENTS

| 5,214,662 | A * | 5/1993 | Irikawa et al. ............ 372/46.01 |
| 6,150,672 | A * | 11/2000 | Kaneko ........................ 257/94 |
| 6,238,945 | B1 * | 5/2001 | Kaneko ........................ 438/46 |
| 6,239,490 | B1 * | 5/2001 | Yamada et al. ............... 257/745 |
| 6,507,042 | B1 * | 1/2003 | Mukai et al. .................. 257/14 |
| 6,751,243 | B2 * | 6/2004 | Mukai ...................... 372/45.01 |
| 6,815,242 | B2 * | 11/2004 | Mukai et al. .................. 438/47 |
| 6,816,525 | B2 * | 11/2004 | Stintz et al. ............... 372/45.01 |
| 7,189,986 | B2 * | 3/2007 | Saito ............................ 257/14 |
| 2003/0042492 | A1 * | 3/2003 | Watanabe ..................... 257/79 |
| 2003/0173571 | A1 * | 9/2003 | Kish et al. .................... 257/85 |

(Continued)

FOREIGN PATENT DOCUMENTS

JP    9-18086    1/1997

(Continued)

OTHER PUBLICATIONS

Ben G. Streetman and Sanjay Jumar Banerjee, "Solid State Electronic Devices" Sixth Edition Prentice Hall, p. 183-184.*

(Continued)

*Primary Examiner*—Minsun Harvey
*Assistant Examiner*—Yuanda Zhang
(74) *Attorney, Agent, or Firm*—Kratz, Quintos & Hanson, LLP

(57) ABSTRACT

An intrinsic GaAs waveguide layer is formed on a p-type AlGaAs cladding layer, a quantum dot active layer is formed further thereon. An n-type AlGaAs cladding layer is formed on the center portion of the quantum dot active layer. Thus-configured semiconductor laser is allowed to successfully suppress the area of the p-n junction plane to a small level, and to obtain a high level of reliability, because there is no need of processing the center portion of the quantum dot active layer, contributive to laser oscillation.

17 Claims, 9 Drawing Sheets

U.S. PATENT DOCUMENTS

| | | | |
|---|---|---|---|
| 2004/0124409 A1* | 7/2004 | Ebe et al. | 257/14 |
| 2004/0169173 A1* | 9/2004 | Saito | 257/14 |
| 2005/0045868 A1* | 3/2005 | Otsubo et al. | 257/14 |
| 2006/0076552 A1* | 4/2006 | Ebe et al. | 257/14 |

FOREIGN PATENT DOCUMENTS

| | | |
|---|---|---|
| JP | 2001-144379 | 5/2001 |
| JP | 2003-309322 | 10/2003 |
| JP | 2004-63957 | 2/2004 |

OTHER PUBLICATIONS

S. Fathpour, et al.; "Characteristics of High-Performance 1.0 μm and 1.3 μm Quantum Dot Lasers: Impact of p-doping and Tunnel Injection;" *Proceedings of the 62$^{nd}$ Device Research Conference, presentation No. VI.C-4*; (2 Sheets.)/Discussed in the specification.

K. Otsubo, et al.; Temperature-Insensitive Eye-Opening under 10-Gb/s Modulation of 1.3-μm P-Doped Quantum-Dot Lasers without Current Adjustments; *Japanese Journal of Applied Physics*; vol. 43; No. 8B; 2004; L1124-L1126./Discussed in the specification.

N. Hatori, et al.; "20° C.-70° C. Temperature Independent 10 Gb/s Operation of a Directly Modulated Laser Diode Using P-doped Quantum Dots;" *Proceedings of 30$^{th}$ European Conference on Optical Communication, presentation No. Th4.3.4*; (2 Sheets.)/Discussed in the specification.

* cited by examiner

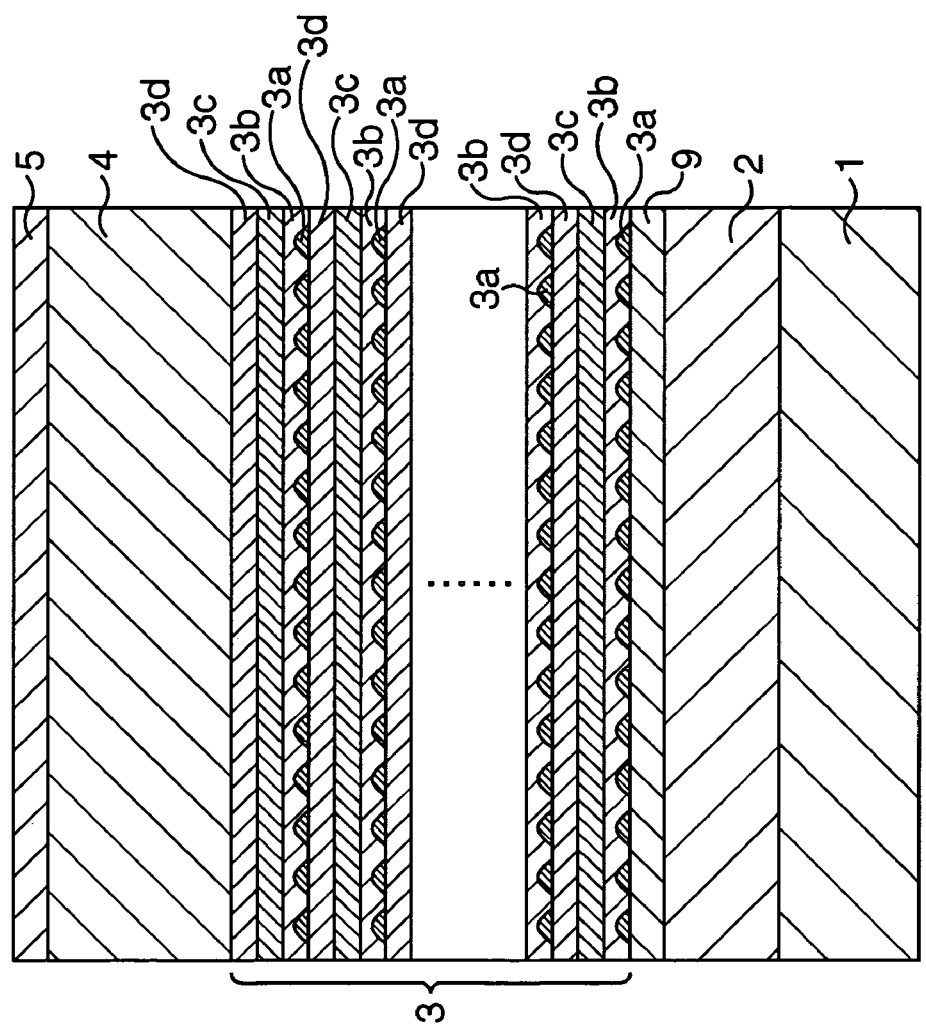

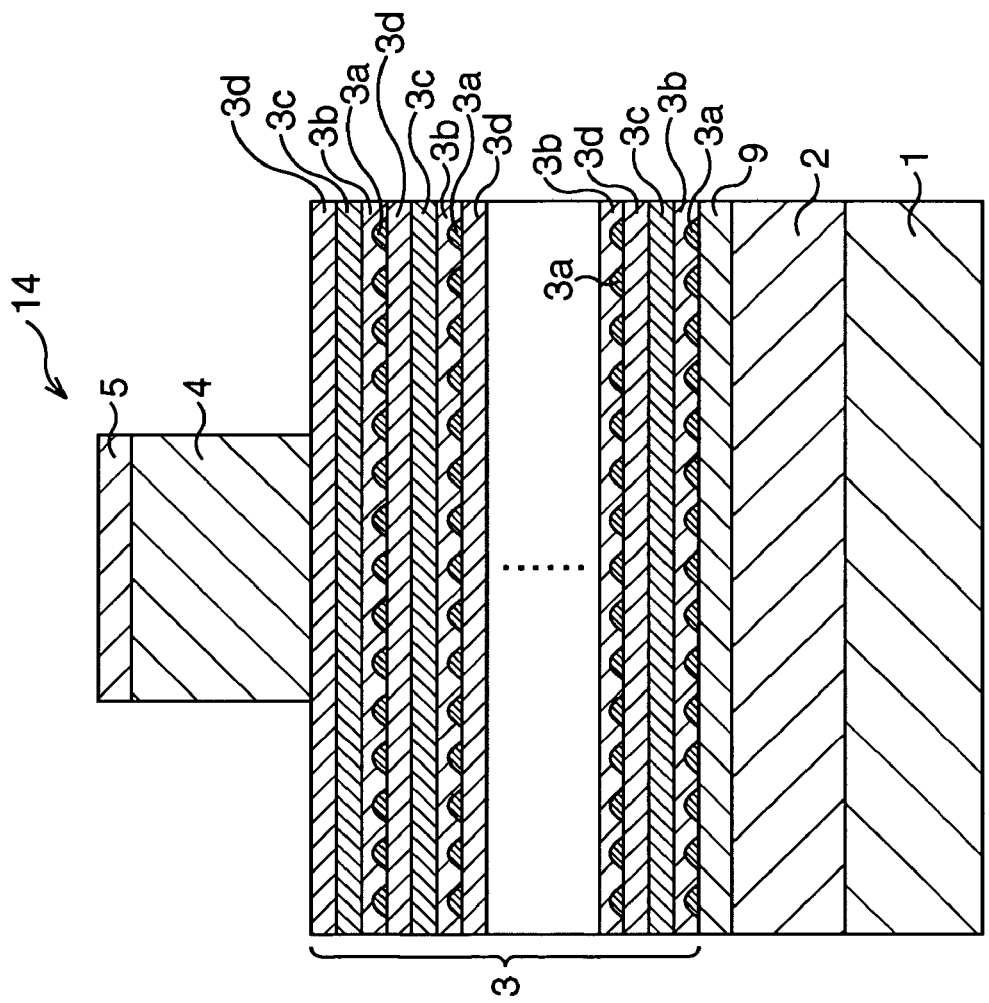

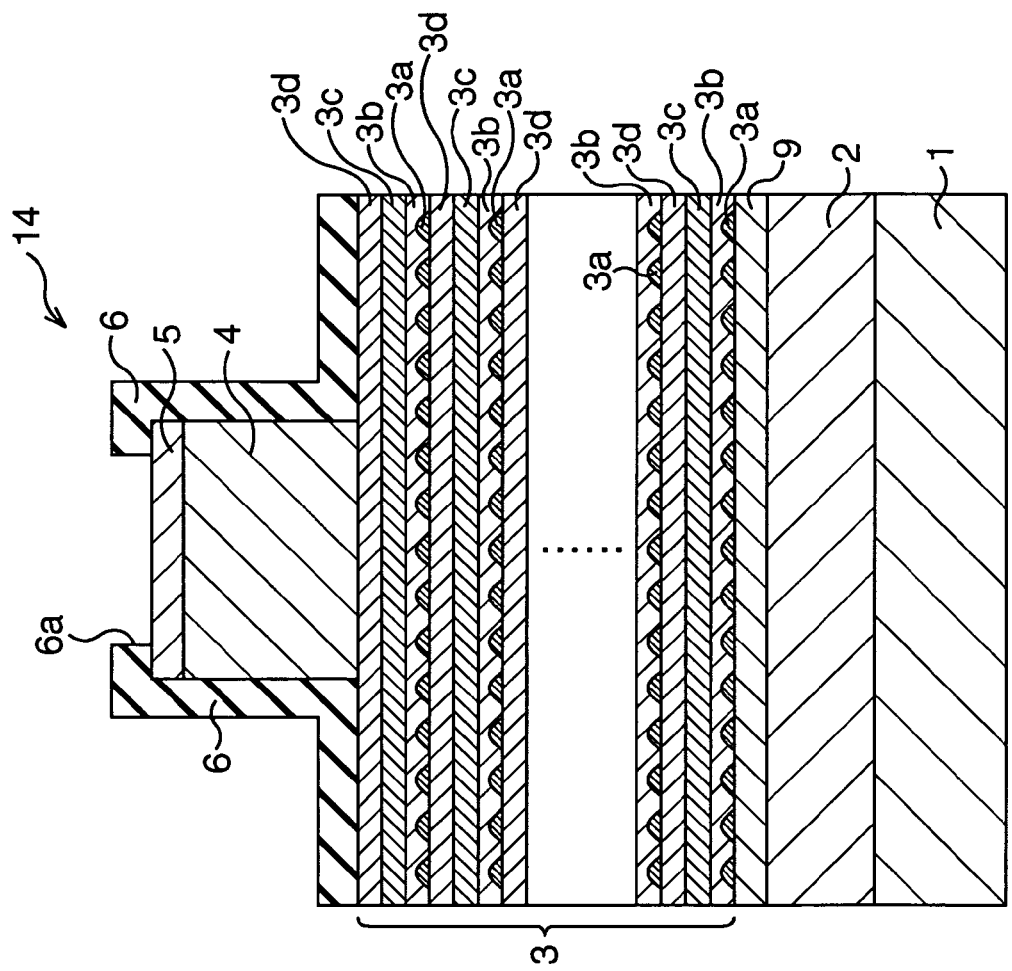

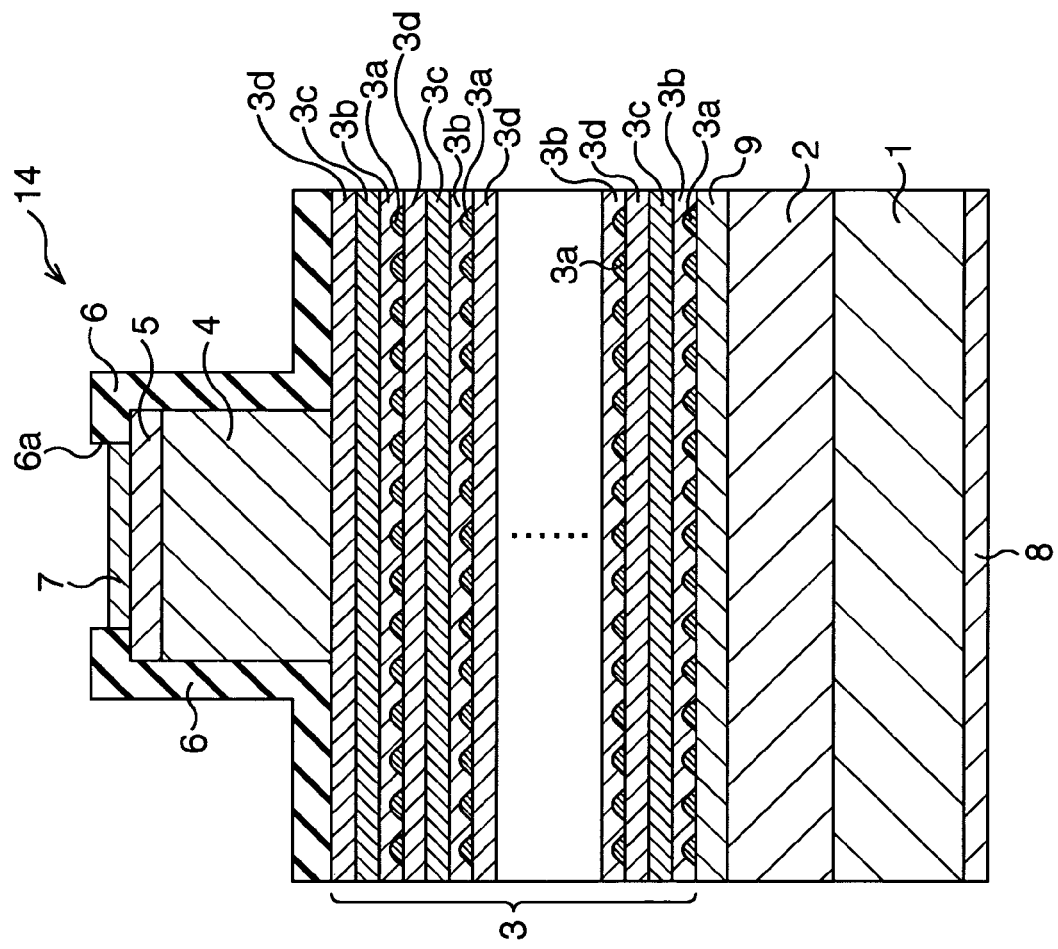

SEMICONDUCTOR LASER AND METHOD OF FABRICATING THE SAME

CROSS-REFERENCE TO RELATED APPLICATIONS

This application is based upon and claims the benefit of priority from the prior Japanese Patent Application No. 2005-104448, filed on Mar. 31, 2005, the entire contents of which are incorporated herein by reference.

BACKGROUND OF THE INVENTION

1. Field of the Invention

The present invention relates to a semiconductor laser suitable for a light source in optical fiber communication, and a method of fabricating the same.

2. Description of the Related Art

Conventionally-used semiconductor lasers are such as those having a non-doped quantum dot active layer formed on an n-type substrate. In recent years, investigation into semiconductor lasers having formed therein a p-type-doped or p-type-modulation-doped (the both will generally be referred to as "p-type-doped", hereinafter) quantum dot active layer, in place of the non-doped quantum dot active layer. The latter semiconductor laser is increased in the differential gain and improved in the modulation characteristics, as compared with the former. It is also made possible to readily suppress the temperature dependence of laser light. The latter semiconductor laser is therefore considered as promising as a light source for metro/access optical fiber communication.

Structures of the conventional semiconductor laser will be explained. The structures of the conventional semiconductor laser are roughly classified into ridge structure and high mesa structure. FIG. 4 is a sectional view showing a conventional ridge-structured semiconductor laser, and FIG. 5 is a sectional view showing a conventional high-mesa-structured semiconductor laser.

The ridge-structured semiconductor laser has, as shown in FIG. 4, an n-type cladding layer 102 formed on an n-type GaAs substrate 101, and has a quantum dot active layer 103 formed further thereon. The quantum dot active layer 103 has a non-doped intrinsic GaAs layer 103c, a p-type GaAs layer 103d and a non-doped intrinsic GaAs layer 103e stacked therein. InAs quantum dots 103b are formed on the non-doped intrinsic GaAs layer 103e. Another intrinsic GaAs layer 103c, another p-type GaAs layer 103d and another intrinsic GaAs layer 103e are stacked so as to cover the InAs quantum dots 103b.

A p-type cladding layer 104 is formed on the center portion of the quantum dot active layer 103, and a p-type contact layer 105 is formed further thereon. Still further thereon, a $SiO_2$ film 106 is formed so as to cover the quantum dot active layer 103, the p-type cladding layer 104 and the p-type contact layer 105. The $SiO_2$ film 106 has an opening formed therein, so as to allow the center portion of the p-type contact layer 105 to expose therein, and an electrode 107 is formed in the opening. The n-type GaAs substrate 101 also has an electrode 108 formed on the back surface thereof.

On the other hand, in the high-mesa-structured semiconductor laser shown in FIG. 5, the quantum dot active layer 103 is formed on the center portion of the n-type cladding layer 102. On the quantum dot active layer 103, the p-type cladding layer 104 and the p-type contact layer 105 are formed.

These semiconductor lasers having the p-type doped quantum dot active layer has been under investigation, but suitability for the practical use has not been reported yet.

The present inventors practically confirmed the operations, and found that the ridge-structured semiconductor laser was incapable of high-speed modulation operation at a speed exceeding 10 Gb/s. The high-mesa-structured semiconductor laser was found to generate current component not contributive to laser oscillation due to surface non-radiative recombination, and to thereby degrade the reliability.

Related arts are disclosed in Patent Document 1 (Japanese Patent Application Laid-Open No. 2004-63957), Patent Document 2 (Japanese Patent Application Laid-Open No. 2003-309322), Patent Document 3 (Japanese Patent Application Laid-Open No. 2001-144379), Patent Document 4 (Japanese Patent Application Laid-Open No. 9-18086), Non-Patent Document 1 (Proceedings of the 62nd Device Research Conference, presentation No. VI.C-4), Non-Patent Document 2 (Japanese Journal of Applied Physics Vol. 43, No. 8B, 2004, pp. L1124-L1126), and Non-Patent Document 3 (Proceedings of 30th European Conference on Optical Communication, presentation No. Th4.3.4).

SUMMARY OF THE INVENTION

It is therefore an object of the present invention to provide a semiconductor laser capable of ensuring high-speed modulation operation and a high level of reliability, even if a p-type doped quantum dot active layer is used, and a method of fabricating the same.

The present inventors made extensive investigations aiming to clarify causes for the above-described problems, and found out that the conventional ridge-structured semiconductor laser had a large parasitic capacitance ascribable to a large area of the p-n junction plane, and this made it difficult to ensure high-speed modulation operation. More specifically, as shown in FIG. 4, the ridge-structured semiconductor laser has a p-n junction plane as the junction plane between the n-type cladding layer 102 and the quantum dot active layer 103; therefore, the p-n junction plane extends over the entire portion of the device. A semiconductor laser having a device length of 500 µm, for example, has a parasitic capacitance (electrostatic capacitance) of several tens of picofarads or around.

On the other hand, the conventional high-mesa-structured semiconductor laser has the p-n junction plane only in the center portion of the device, so that semiconductor laser having a device length of 500 µm, for example, has a parasitic capacitance of as small as 4 pf or around. Formation of the high mesa structure, however, needs etching of the individual layers composing the quantum dot active layer 103, and this undesirably induces the surface non-radiative recombination and the like.

Based on the findings in the above, the present inventors conceived several aspects of the present invention as described below.

A semiconductor laser according to the present invention has a p-type first semiconductor layer; a second semiconductor layer formed above the first semiconductor layer, and having a band gap smaller than that of the first semiconductor layer; quantum dots formed directly or indirectly above the second semiconductor layer, and having a band gap smaller than that of the second semiconductor layer; a third semiconductor layer formed directly or indirectly above the quantum dots, and having a band gap larger than that of the quantum dots; and an n-type fourth semiconductor layer selectively formed above the third semiconductor layer, and having a band gap larger than that of the third semiconductor layer. Conductivity type of at least the one selected from the group consisting of the second semiconductor layer, the quantum dots and the third semiconductor layer is p-type.

In a method of fabricating a semiconductor laser according to the present invention, a second semiconductor layer having a band gap smaller than that of a p-type first semiconductor layer is formed above the first semiconductor layer, and quantum dots having a band gap smaller than that of the second semiconductor layer is then formed directly or indirectly above the second semiconductor layer. Next a third semiconductor layer having a band gap larger than that of the quantum dots is formed directly or indirectly above the quantum dots. Next, an n-type fourth semiconductor layer having a band gap larger than that of the third semiconductor layer is selectively formed above the third semiconductor layer. Conductivity type of at least the one selected from the group consisting of the second semiconductor layer, the quantum dots and the third semiconductor layer is p-type.

BRIEF DESCRIPTION OF THE DRAWINGS

FIGS. 1A to 1E are sectional views sequentially showing a method of fabricating a semiconductor laser according to a first embodiment of the present invention;

DETAILED DESCRIPTION OF THE PREFERRED EMBODIMENTS

Paragraphs below will describe embodiments of the present invention, referring to the attached drawings.

First Embodiment

The first embodiment of the present invention will be described. It is to be noted that a structure of the semiconductor laser will be described in conjunction with a method of fabrication of the same for the convenience's sake. FIGS. 1A to 1E are sectional views sequentially showing a method of fabricating the semiconductor laser according to the first embodiment of the present invention.

Figure 1A:
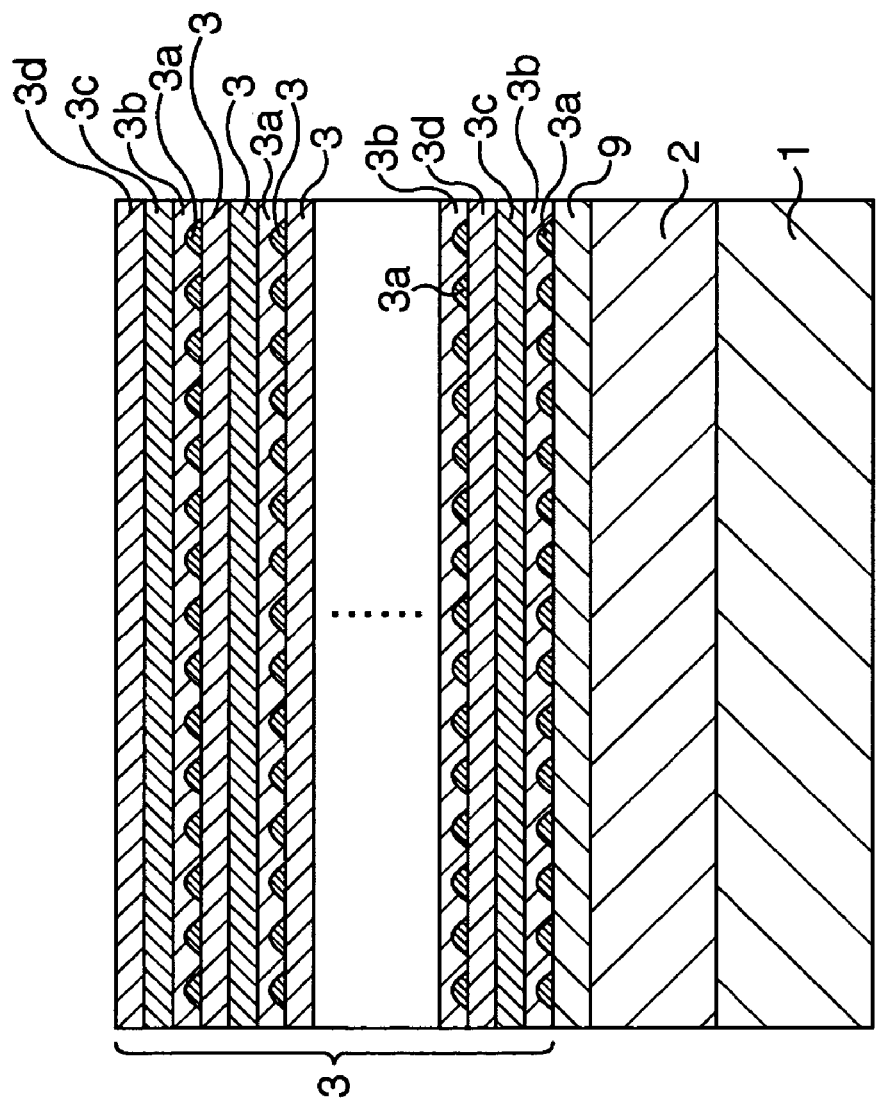

In this embodiment, first, as shown in FIG. 1A, a p-type $Al_{0.4}Ga_{0.6}As$ cladding layer 2 and a non-doped intrinsic GaAs waveguide layer 9 are formed in this order on a p-type GaAs substrate 1. The p-type GaAs substrate 1 used herein is such as having a (001) surface, for example. The thicknesses of the p-type $Al_{0.4}Ga_{0.6}As$ cladding layer 2 and the intrinsic GaAs waveguide layer 9 are set to 1.4 µm or around, and 36 nm or around, respectively.

Next, a p-type quantum dot active layer 3 is formed on the intrinsic GaAs waveguide layer 9. Formation of the p-type quantum dot active layer 3 begins with formation of a plurality of InAs quantum dots 3a by self-assembled method on the intrinsic GaAs waveguide layer 9. In this process, also a thin wetting layer, although not shown, is formed on the bottom and the periphery of the InAs quantum dots 3a. Next, a non-doped intrinsic GaAs barrier layer 3b is formed so as to cover the InAs quantum dots 3a. The thickness of the intrinsic GaAs barrier layer 3b is set to 14 nm or around, for example. It is preferable, before the intrinsic GaAs barrier layer 3b is formed, to preliminarily form an InGaAs layer (not shown) over the InAs quantum dots 3a, for the purpose of adjusting wavelength. In this case, the intrinsic GaAs barrier layer 3b is formed on the InAs quantum dots 3a, while partially or extensively placing the InGaAs layer in between in an indirect manner. Similarly, there is a case in which an InGaAs layer is preliminarily formed on the intrinsic GaAs waveguide layer 9 before the InAs quantum dots 3a are formed. In this case, the InAs quantum dots 3a are formed on the intrinsic GaAs waveguide layer 9, while placing the InGaAs layer in between. For the case where one or two InGaAs layers are formed, the band gap of the InGaAs layer is set smaller than that of the wetting layer, and set larger than that of the InAs quantum dots 3a. For the case where two InGaAs layers are formed, there is no limitation on which band gaps of both InGaAs layers should be smaller or larger.

After formation of the intrinsic GaAs barrier layer 3b, a p-type GaAs barrier layer 3c is formed on the intrinsic GaAs barrier layer 3b. The p-type GaAs barrier layer 3c formed herein is such as containing approximately $5 \times 10^{17}$ cm$^{-3}$ of Be as an p-type impurity. The thickness of the p-type GaAs barrier layer 3c is 10 nm or around, for example. A non-doped intrinsic GaAs barrier layer 3d is then formed on the p-type GaAs barrier layer 3c. The thickness of the intrinsic GaAs barrier layer 3d is 12 nm or around, for example.

Next, nine similar sets of stacks, each composed of the InAs quantum dots 3a, the intrinsic GaAs barrier layer 3b, the p-type GaAs barrier layer 3c and the intrinsic GaAs barrier layer 3d, are successively formed. As a consequence, ten layers of the InAs quantum dots 3a reside in the quantum dot active layer 3.

Next, as shown in FIG. 1B, an n-type $Al_{0.4}Ga_{0.6}As$ cladding layer 4 and an n-type GaAs contact layer 5 are stacked in this order on the p-type quantum dot active layer 3. The thicknesses of the n-type $Al_{0.4}Ga_{0.6}As$ cladding layer 4 and the n-type GaAs contact layer 5 are, for example, set to 1.4 µm or around, and 0.4 µm or around, respectively.

These semiconductor layers are formed by a molecular beam epitaxy (MBE) process, for example.

Next, as shown in FIG. 1C, the n-type GaAs contact layer 5 and the n-type $Al_{0.4}Ga_{0.6}As$ cladding layer 4 are patterned by photolithography and wet etching, and thereby leave a ridged mesa portion 14 composed of these layers only on the center portion of the quantum dot active layer 3. The patterning of the n-type GaAs contact layer 5 and the n-type $Al_{0.4}Ga_{0.6}As$ cladding layer 4 is stopped by time control, for example.

Thereafter, as shown in FIG. 1D, a $SiO_2$ film 6 is formed so as to cover the top surface of the quantum dot active layer 3, the side faces of the n-type $Al_{0.4}Ga_{0.6}As$ cladding layer 4, and the top surface and the side faces of the n-type GaAs contact layer 5. An opening 6a is then formed in the $SiO_2$ film 6 so as to expose therein a portion of the top surface of the n-type GaAs contact layer 5.

Then as shown in FIG. 1E, an electrode 7 for current supply is formed in the opening 6a. An electrode 8 for current supply is also formed on the back surface of the p-type GaAs substrate 1. These electrodes 7 and 8 are formed by laser processing, for example.

In thus-fabricated semiconductor laser, the band gap of the intrinsic GaAs waveguide layer 9 (second semiconductor layer) is smaller than that of the p-type $Al_{0.4}Ga_{0.6}As$ cladding layer 2 (first semiconductor layer). The band gap of the InAs quantum dots 3a is smaller than that of the intrinsic GaAs waveguide layer 9. The band gaps of the intrinsic GaAs barrier layer 3b, the p-type GaAs barrier layer 3c and the intrinsic GaAs barrier layer 3d (third semiconductor layer) are larger than that of the InAs quantum dots 3a. In addition, the band gap of the n-type $Al_{0.4}Ga_{0.6}As$ cladding layer 4 (fourth semiconductor layer) is larger than those of the intrinsic GaAs barrier layer 3b, the p-type GaAs barrier layer 3c and the intrinsic GaAs barrier layer 3d (third semiconductor layer).

Figure 5:
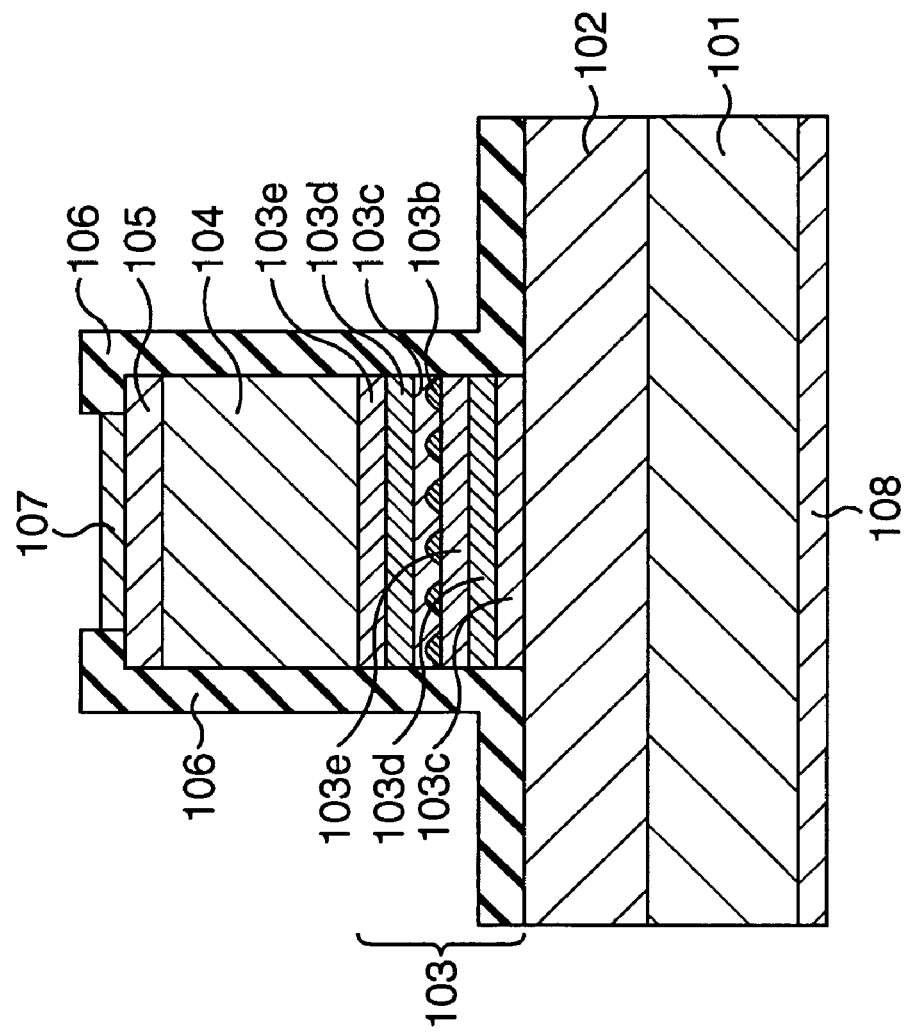
FIG. 5 is a sectional view showing a conventional high-mesa-structured semiconductor laser.

The p-n junction plane herein is a junction plane between the p-type quantum dot active layer 3 and the n-type $Al_{0.4}Ga_{0.6}As$ cladding layer 4. The n-type $Al_{0.4}Ga_{0.6}As$ cladding layer 4 resides only on the center portion of the quantum dot active layer 3. The semiconductor laser therefore makes it possible to suppress the area of the p-n junction plane to a small level, similarly to the conventional high-mesa-structured semiconductor laser (see FIG. 5), and thereby to suppress generation of parasitic capacitance such as large as disabling the high-speed modulation operation. In the fabrication process, it is also made possible to suppress degradation in the reliability ascribable to the surface non-radiative recombination and the like, because there is no need of processing the individual layers 3a to 3d composing the quantum dot active layer 3.

Second Embodiment

Figure 2:
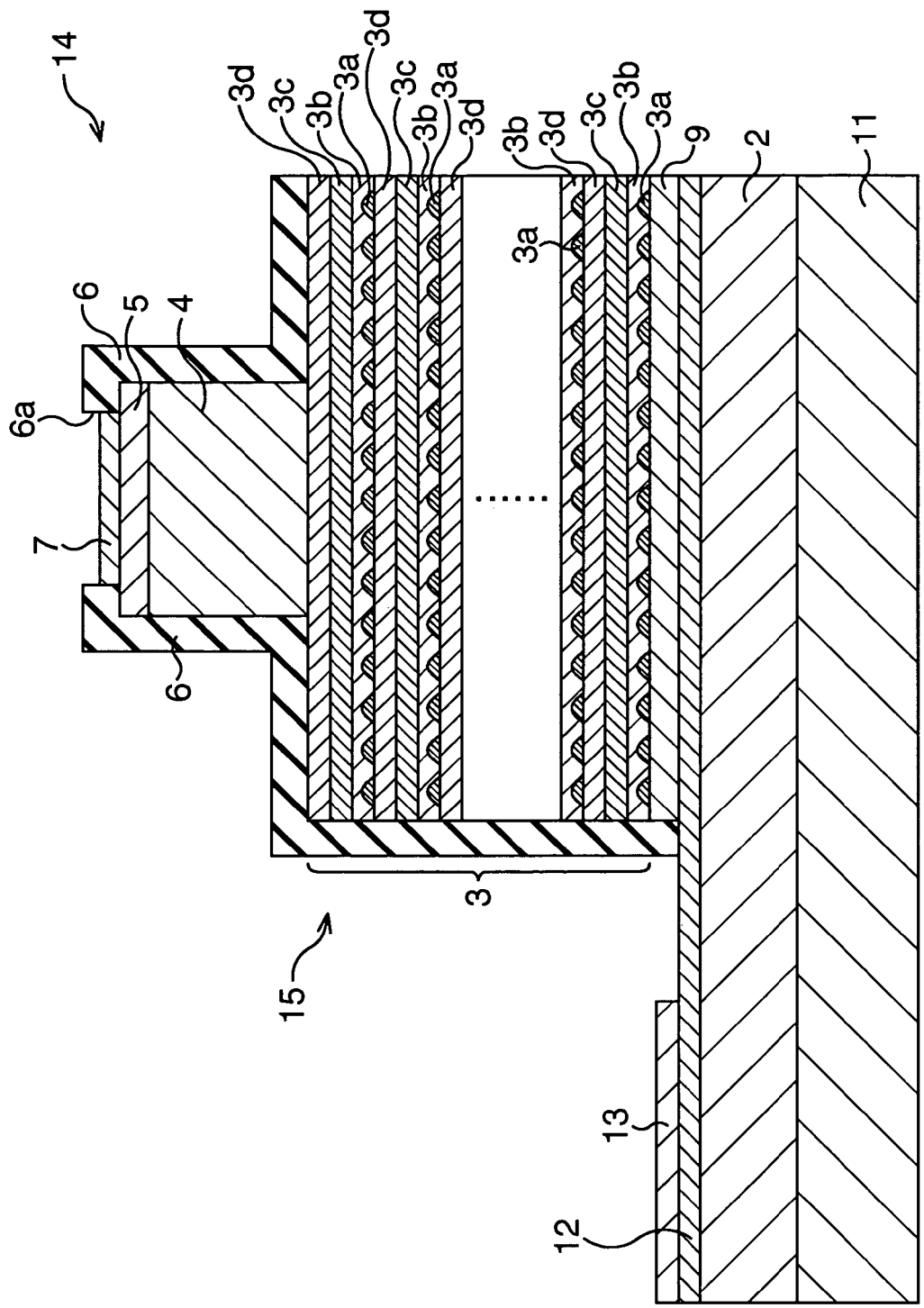
FIG. 2 is a sectional view showing a semiconductor laser according to a second embodiment of the present invention.

Next, paragraphs will explain the second embodiment of the present invention. The description here will be made mainly on aspects different from those in the first embodiment. FIG. 2 is a sectional view showing a semiconductor laser according to the second embodiment of the present invention.

In the second embodiment, first, as shown in FIG. 2, the p-type $Al_{0.4}Ga_{0.6}As$ cladding layer 2 and a p-type GaAs contact layer 12 are formed in this order on a n-type GaAs substrate 11. The n-type GaAs substrate 11 used herein is such as having a (001) surface. It is also allowable to use a high-resistivity GaAs substrate, in place of the n-type GaAs substrate 11. The thickness of the p-type GaAs contact layer 12 is 0.4 μm, for example.

Next, similarly to as described in the first embodiment, the intrinsic GaAs waveguide layer 9, the quantum dot active layer 3, the n-type $Al_{0.4}Ga_{0.6}As$ cladding layer 4 and the n-type GaAs contact layer 5 are formed in this order on the p-type GaAs contact layer 12. Next, again similarly to as described in the first embodiment, the n-type GaAs contact layer 5 and the n-type $Al_{0.4}Ga_{0.6}As$ cladding layer 4 are patterned to thereby form the ridged mesa portion 14. The quantum dot active layer 3 and the intrinsic GaAs waveguide layer 9 are then patterned to obtain a mesa portion 15 having a width sufficiently larger than the sum of the ridged mesa portion width and the length of carrier diffusion.

Thereafter, similarly to as described in the first embodiment, the $SiO_2$ film 6 and the electrode 7 are formed. Also an electrode 13 is formed on the p-type GaAs contact layer 12. The $SiO_2$ film 6 herein is formed also on the side face on the electrode 13 side of the quantum dot active layer 3.

Also the second embodiment as described in the above can obtain the effects similar to those in the first embodiment. The quantum dot active layer 3 in the second embodiment is patterned, but almost no influence is exerted on the center portion thereof contributive to the laser oscillation. The second embodiment, therefore, makes it possible to obtain a high level of reliability similarly to the first embodiment.

Third Embodiment

Figure 3:
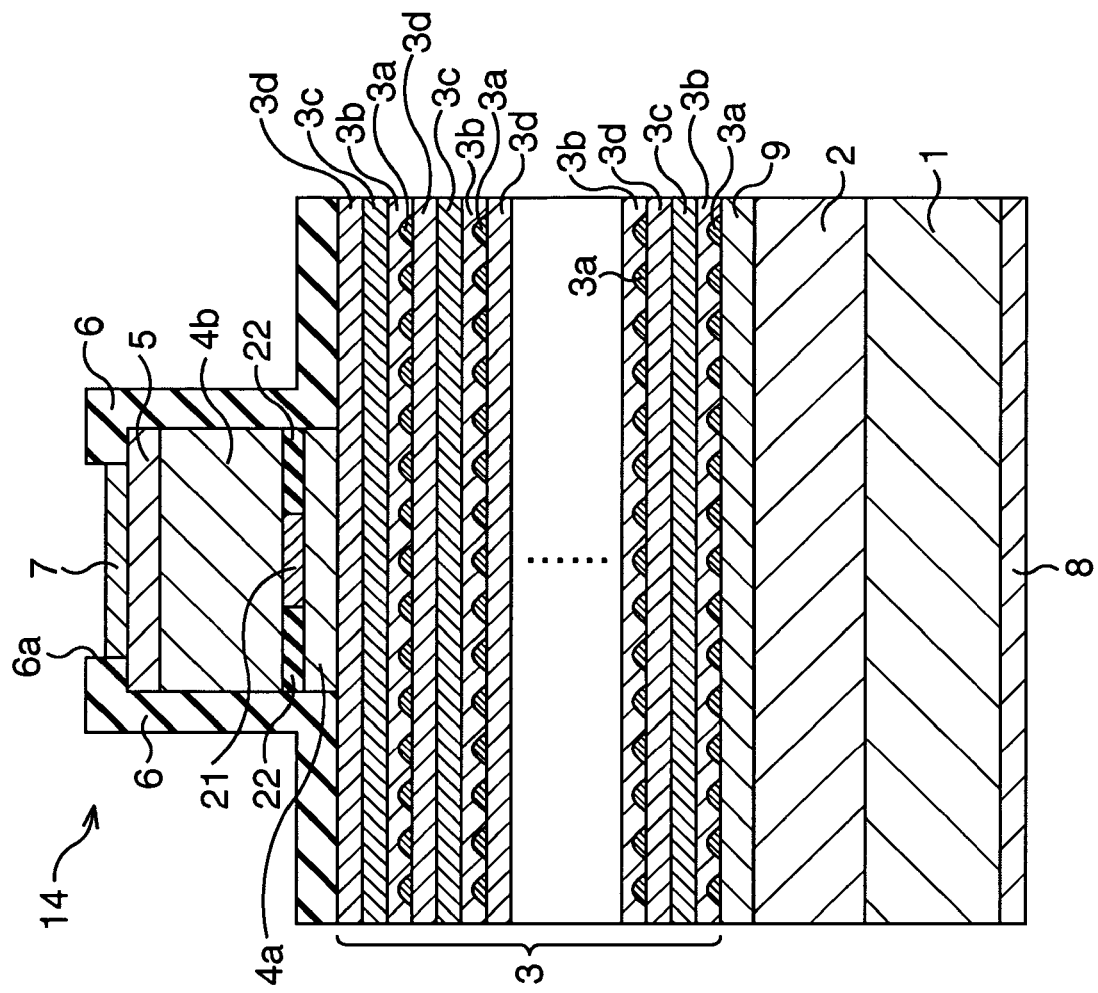
FIG. 3 is a sectional view showing a semiconductor laser according to a third embodiment of the present invention.
Figure 4:
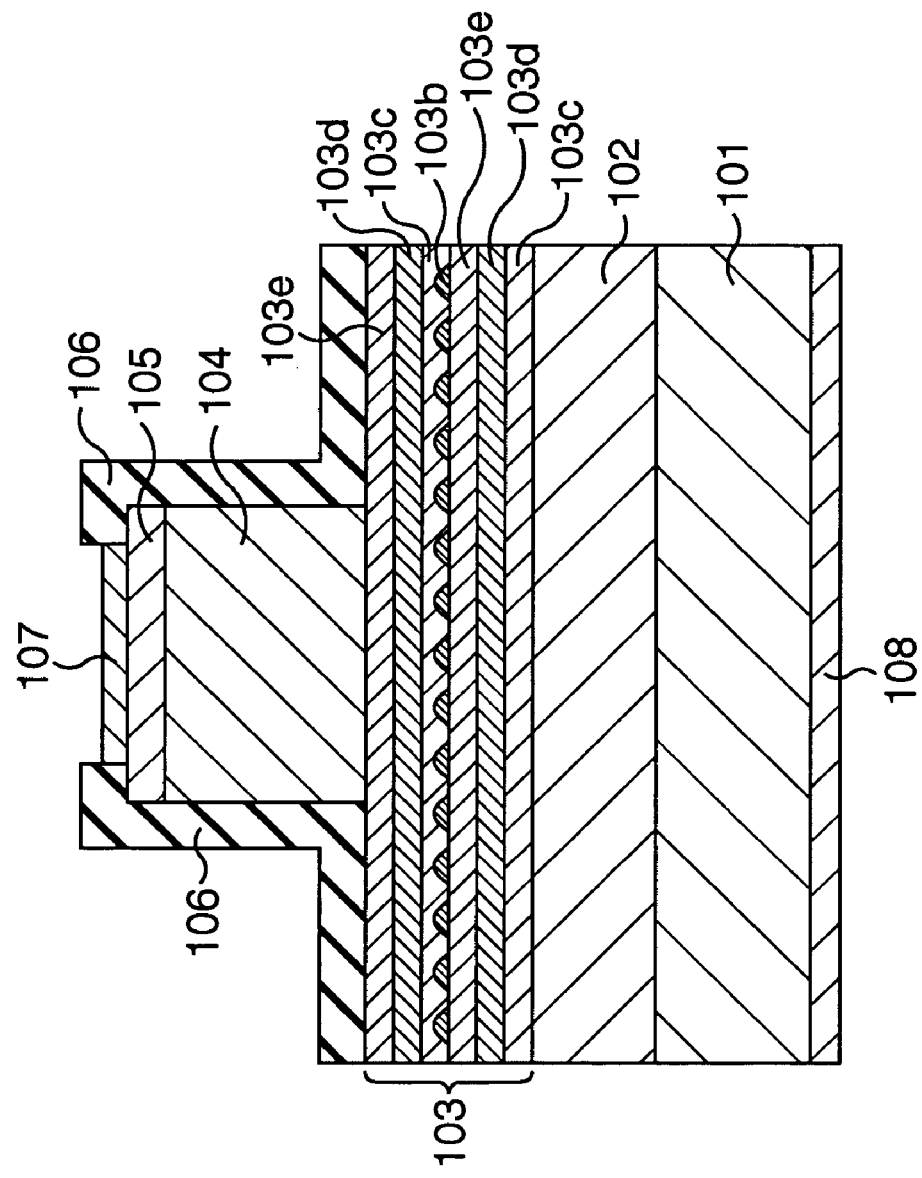
FIG. 4 is a sectional view showing a conventional ridge-structured semiconductor laser.

Next paragraphs will describe the third embodiment of the present invention. FIG. 3 is a sectional view showing a semiconductor laser according to the third embodiment of the present invention.

In the third embodiment, an n-type $Al_{0.4}Ga_{0.6}As$ cladding layer 4a is formed on the quantum dot active layer 3. The thickness of the n-type $Al_{0.4}Ga_{0.6}As$ cladding layer 4a is set to 150 nm, for example. An n-type AlAs layer 21 is formed on the center portion of the n-type $Al_{0.4}Ga_{0.6}As$ cladding layer 4a, and an AlAs oxide layer 22 is formed around the n-type AlAs layer 21. The thickness of the n-type AlAs layer 21 and the AlAs oxide layer 22 is 30 nm, for example. An n-type $Al_{0.4}Ga_{0.6}As$ cladding layer 4b is formed on the n-type AlAs layer 21 and the AlAs oxide layer 22. The thickness of the n-type $Al_{0.4}Ga_{0.6}As$ cladding layer 4b is 1.25 μm or around, for example. Other configurations are same as those in the first embodiment.

In thus-configured third embodiment, the n-type AlAs layer 21 and the AlAs oxide layer 22 serve as the current confinement portion. This further improves stability of the laser light. It is also allowable herein to omit the n-type $Al_{0.4}Ga_{0.6}As$ cladding layer 4a, and instead the current confinement portion is formed directly on the quantum dot active layer 3.

The above-described current confinement portion can be formed, for example, by forming a n-type AlAs layer and the n-type $Al_{0.4}Ga_{0.6}As$ cladding layer 4b in this order on the n-type $Al_{0.4}Ga_{0.6}As$ cladding layer 4a, by patterning these layers, and then by selectively oxidizing the edge portion of the n-type AlAs layer. More specifically, it is all enough to form the ridged-mesa structure and to subject it to thermal oxidation in a steam atmosphere.

The components and composition of the individual semiconductor layers are by no means limited to those in the first to third embodiment, so far as the relations of the band gap similarly to those in the first embodiment hold. There are also no special limitations on the thickness, dopant species and dopant concentration of the individual semiconductor layers. Conductivity type of the InAs quantum dots 3a and/or the GaAs waveguide layer 9 may be p-type. For the case where the conductivity type of the InAs quantum dots 3a and/or the GaAs waveguide layer 9 is p-type, the GaAs barrier layer 3c may be configured by a non-doped intrinsic semiconductor.

The present invention is applicable also to various structures such as FP (Fabry-Perot) laser structure, DFB (distributed feedback) laser structure and DBR (distributed Bragg reflection) laser structure.

According to the present invention, it is made possible to suppress increase in area of the p-n junction plane even if the p-type doped quantum dot active layer is adopted. This consequently enables high-speed modulation operation. It is also made possible to obtain a high level of reliability because there is no need of processing the films (layers) composing the quantum dot active layer.

What is claimed is:

1. A semiconductor laser comprising:
   a p-type cladding layer;
   a second semiconductor layer formed above said p-type cladding layer, and having a band gap smaller than that of said p-type cladding layer;
   a p-type quantum dot active layer formed above said second semiconductor layer and including:
   a plurality of layers which have quantum dots having a band gap smaller than that of said second semiconductor layer; and
   a plurality of p-type or intrinsic third semiconductor layers formed above said layers which have quantum dots, and having a band gap larger than that of the quantum dots, conductivity type of at least one selected from the group consisting of said second semiconductor layer, said quantum dots and said third semiconductor layer being p-type, and at least either one of said quantum dots and said third semiconductor layer having p-type conductivity, wherein each of said layers which have quantum dots and each of said third semiconductor layers are alternated in said p-type quantum dot active layer; and an n-type cladding layer selectively formed on said quantum dot active layer, and having a band gap larger than that of said third semiconductor layer, there being a pin-junction interface between said n-type cladding layer and said quantum dot active layer, wherein an area of said pin-junction interface is smaller than an area of an interface between said second semiconductor layer and said quantum dot active layer.

2. The semiconductor laser according to claim 1, wherein at least either one of said second semiconductor layer and said third semiconductor layer has p-type conductivity, and said quantum dots are configured using an intrinsic semiconductor.

3. The semiconductor laser according to claim 1, wherein said quantum dots have p-type conductivity, and at least either one of said second semiconductor layer and said third semiconductor layer is configured using an intrinsic semiconductor.

4. The semiconductor laser according to claim 1, wherein a plurality of structures each comprising said quantum dots and said third semiconductor layer are successively stacked.

5. The semiconductor laser according to claim 1, having a ridge-formed waveguide structure.

6. The semiconductor laser according to claim 1, further comprising:
    a current confinement portion formed above said n-type cladding layer; and
    an n-type fifth semiconductor layer formed above said current confinement portion.

7. The semiconductor laser according to claim 6, wherein said current confinement portion further comprises:
    an n-type semiconductor layer; and
    an oxide layer formed around said n-type semiconductor layer.

8. A method of fabricating a semiconductor laser comprising the steps of:
    forming, above a p-type cladding layer, a second semiconductor layer having a band gap smaller than that of said p-type cladding layer;
    forming a p-type quantum dot active layer above said second semiconductor layer, the step of forming said p-type quantum dot active layer including the steps of:
        forming a plurality of layers which have quantum dots having a band gap smaller than that of said second semiconductor layer; and
        forming, above said quantum dots, a plurality of p-type or intrinsic third semiconductor layers having a band gap larger than that of said quantum dots, at least one selected from the group consisting of said second semiconductor layer, said quantum dots and said third semiconductor layer having a p-type conductivity, and at least either one of said quantum dots and said third semiconductor layer having p-type conductivity, wherein each of said layers which have quantum dots and each of said third semiconductor layers are alternated in said p-type quantum dot active layer; and selectively forming, on said quantum dot active layer, an n-type cladding layer having a band gap larger than that of said third semiconductor layer, there being a pin-junction interface between said n-type cladding layer and said quantum dot active layer, wherein an area of said pin-junction interface is smaller than an area of an interface between said second semiconductor layer and said quantum dot active layer.

9. The method of fabricating a semiconductor laser according to claim 8, wherein at least either one of said second semiconductor layer and said third semiconductor layer has p-type conductivity, and said quantum dots are configured using an intrinsic semiconductor.

10. The method of fabricating a semiconductor laser according to claim 8, wherein said quantum dots have p-type conductivity, and at least either one of said second semiconductor layer and said third semiconductor layer is configured using an intrinsic semiconductor.

11. The method of fabricating a semiconductor laser according to claim 8, wherein a plurality of structures each comprising said quantum dots and said third semiconductor layer are successively stacked, before forming said fourth semiconductor layer.

12. The method of fabricating a semiconductor laser according to claim 8, further comprising the step of configuring a waveguide as having a ridge structure.

13. The method of fabricating a semiconductor laser according to claim 8, wherein said step of selectively forming said n-type cladding layer comprises the step of:
    forming an n-type semiconductor layer above said third semiconductor layer; and
    patterning said n-type semiconductor layer.

14. The method of fabricating a semiconductor laser according to claim 13, wherein said step of patterning said n-type semiconductor layer comprises the step of etching said n-type semiconductor layer to a depth allowing the surface of a quantum dot active layer including said first to third semiconductor layers and said quantum dots to expose.

15. The method of fabricating a semiconductor laser according to claim 8, further comprising the steps of:
    forming a current confinement portion above said n-type cladding layer; and
    forming a fifth semiconductor layer above said current confinement portion.

16. The method of fabricating a semiconductor laser according to claim 15, wherein said step of forming said current confinement portion comprises the steps of:
    forming an n-type semiconductor layer; and
    oxidizing the edge portion of said n-type semiconductor layer.

17. The method of fabricating a semiconductor laser according to claim 8, said quantum dots are formed by self-assembled method.

* * * * *